(12) United States Patent
Ohkuma et al.

(10) Patent No.: US 6,986,982 B2
(45) Date of Patent: Jan. 17, 2006

(54) RESIST MATERIAL AND METHOD OF MANUFACTURING INKJET RECORDING HEAD USING THE SAME

(75) Inventors: Norio Ohkuma, Tokyo (JP); Hikaru Ueda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 153 days.

(21) Appl. No.: 10/368,580

(22) Filed: Feb. 20, 2003

(65) Prior Publication Data

US 2003/0159288 A1    Aug. 28, 2003

(30) Foreign Application Priority Data

Feb. 20, 2002    (JP)    ............................. 2002-043805

(51) Int. Cl.
*B41J 2/01*    (2006.01)
*B41J 2/135*    (2006.01)

(52) U.S. Cl. ..................... 430/320; 216/27; 430/270.1; 526/316

(58) Field of Classification Search ................ 430/320, 430/270.1; 526/316; 216/27
See application file for complete search history.

(56) References Cited

U.S. PATENT DOCUMENTS

| | | | | |
|---|---|---|---|---|
| 3,853,814 | A * | 12/1974 | Guillet | 526/316 |
| 4,018,937 | A * | 4/1977 | Levine et al. | 430/270.1 |
| 4,297,433 | A | 10/1981 | Tsuda et al. | 430/270 |
| 5,218,376 | A | 6/1993 | Asai | 346/1.1 |
| 5,331,344 | A | 7/1994 | Miyagawa et al. | 347/63 |
| 5,478,606 | A | 12/1995 | Ohkuma et al. | 427/555 |
| 6,155,673 | A | 12/2000 | Nakajima et al. | 347/61 |
| 6,461,798 | B1 | 10/2002 | Ohkuma et al. | 430/320 |

FOREIGN PATENT DOCUMENTS

| | | |
|---|---|---|
| JP | 4-10940 | 1/1992 |
| JP | 4-10942 | 1/1992 |
| JP | 6-286149 | 10/1994 |
| JP | 8-323985 | 12/1996 |

OTHER PUBLICATIONS

Kaufmann et al, eds., "Introduction to Polymer Science and Technology: An SPE Textbook", (SPE monographs: No. 2) from Chapter 4, by Billmeyer, Wiley-Interscience Publication, John Wiley&Sons, New York, NY, 1977,pp 153-154, 162-176.*

Namariyama, Yoichi, PTO 04-[0841] Translation of Nippon Shashin Gakkaishi (1980), vol. 43, No. 5, pp 298-304, by USPTO Washington DC Dec. 2004 by Schreiber Translations, Inc., 23 pages.*

Namariyama, Yoichi, "Studies of Photodegradation of Polymers and its Application to the Positive Photoresist (IV)—Photodegradation and Spectral energy sensitivity of MIK-Acrylate copolyers-", Nippon Shashin Gakkaishi (1980), vol. 43, No. 5, pp 298-304.*

* cited by examiner

*Primary Examiner*—Cynthia Hamilton
(74) *Attorney, Agent, or Firm*—Fitzpatrick, Cella, Harper & Scinto

(57) ABSTRACT

Provided is a resist material that comprises a polymer compound represented by the following general formula (I):

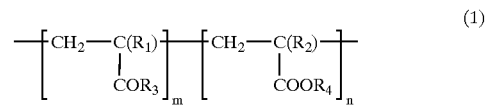

where $R_1$ and $R_2$ are each independently a hydrogen atom or an alkyl group; $R_3$ and $R_4$ are each independently an alkyl group; m and n are positive integers.

6 Claims, 7 Drawing Sheets

RESIST MATERIAL AND METHOD OF MANUFACTURING INKJET RECORDING HEAD USING THE SAME

BACKGROUND OF THE INVENTION

1. Field of the Invention

The present invention relates a resist material and a method of manufacturing an inkjet recording head using the resist material.

2. Related Background Art

As a resist material useful with deep-UV (UV rays of about 300 nm or shorter wavelength), polymethyl methacrylate (hereinafter referred to as "PMMA") has been known. Also, polymethyl isopropenyl ketone (hereinafter referred to as "PMIPK") is known as a resist material of higher sensitivity than PMMA. In addition, the specification of U.S. Pat. No. 4,297,433 discloses a sensitizing agent useful for improving the sensitivity of PMIPK.

Recently, the excimer laser has been introduced as an apparatus to take out deep-UV, and resist materials usable in the deep UV range are reevaluated. The resist materials such as PMMA and PMIPK are useful materials for micromachining to achieve a high aspect ratio, rather than for so-called micro-patterning in the sub-micron order.

The resist materials such as PMMA and PMIPK absorb deep-UV rays, with which main chain of the polymer (called Norrish reaction) is cut so that the solubility of the resist material to a developing solution changes to enable patterning. However, the sensitivity of such resist materials is not sufficient even if the sensitizing agent disclosed in the specification of U.S. Pat. No. 4,297,433 is used together.

On the other hand, various methods have hitherto been proposed for manufacturing a head for inkjet-recording system. Japanese Patent Application Laid-Open Nos. 06-286149 and 08-323985 disclose methods of manufacturing inkjet recording heads highly suitable for obtaining high-quality images.

Japanese Patent Application Laid-Open No. 06-286149 discloses a method of manufacturing an inkjet recording head suitable for an ink ejection method disclosed in Japanese Patent Application Laid-Open Nos. 04-10940 to 04-10942 where a driving signal corresponding to recording data is applied to an ink ejection pressure generating element (electrothermal conversion element), and the electrothermal converting element generates heat energy sufficient enough to cause temperature rise over the nuclear boiling point of the ink, so that a bubble is generated in the ink, and when the bubble communicates with outside air an ink droplet is ejected.

In Japanese Patent Application Laid-Open Nos. 06-286149 and 08-323985, PMIPK or its derivative is used for the flow path pattern (a mold for the ink flow path formation). However, as described above, insufficient sensitivity of PMIPK is an obstacle in achieving a high productivity.

Lately, image quality comparable to a silver-salt photograph is required even to ink jet recording. To attain this, ink droplets as small as about 10 pico liters (pl) must be ejected with good repeatability. Thus, much finer shaping is required for nozzles.

Japanese Patent Application Laid-Open Nos. 06-286149 and 08-323985 disclose that the dimensional accuracy in nozzle formation is improved by preventing mutual dissolution between the material used for the coating resin layer where ejection openings are formed and the material used for the flow-path pattern to form flow paths. The present inventors further investigated this point to find that when ink ejection openings are is formed by photolithographic patterning of the coating resin, the shape of the ejection opening is subtly deformed due to the reflection taking place between the flow path pattern and the coating resin layer, affecting the yield.

SUMMARY OF THE INVENTION

The present invention was made considering the aforementioned problems. Thus, an object of the present invention is to provide a deep-UV resist material having a higher sensitivity. Another object of the present invention is to provide a method of manufacturing an inkjet-recording head with an improved productivity. A further object of the present invention is to provide a method of manufacturing an inkjet-recording head having a finer nozzle structure.

The aforementioned objects can be attained by the present invention described below.

According to one aspect of the present invention, there is provided a resist material containing a polymer compound represented by a general formula (I) shown below.

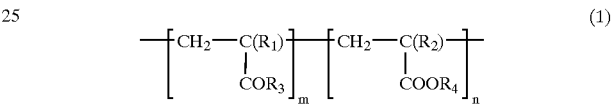

where $R_1$ and $R_2$ are each independently a hydrogen atom or an alkyl group; $R_3$ and $R_4$ are each independently an alkyl group; m and n are positive integers.

According to another aspect of the present invention, there is provided a method of manufacturing an inkjet recording head comprising the steps of:

(i) forming a layer containing the resist material mentioned above on a substrate on which ink ejection pressure generating element has been provided, and then patterning the layer to form an ink flow-path pattern;

(ii) applying a liquid containing an epoxy resin that is solid at normal temperature onto the flow-path pattern, thereby forming a coating resin layer serving as the walls of ink flow-path;

(iii) removing the coating resin layer positioned on the ink ejection pressure generating element, thereby forming an ink ejection opening; and (iv) removing the flow path pattern.

DETAILED DESCRIPTION OF THE PREFERRED EMBODIMENTS

Figure 1:
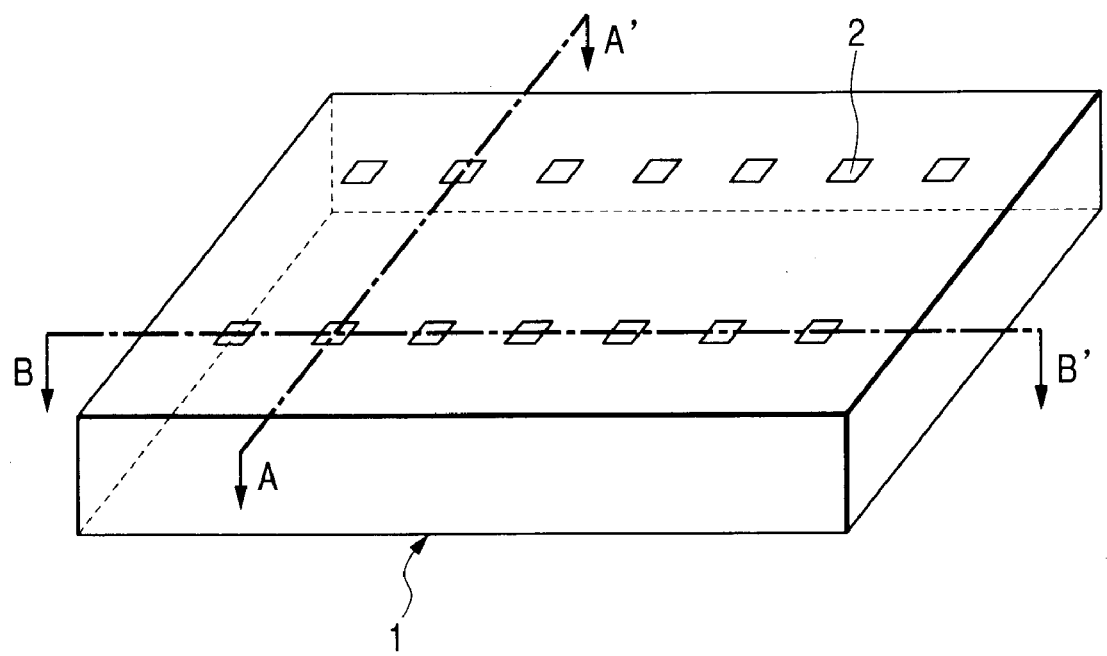
FIG. 1 is a schematic perspective view of a substrate having ink ejection pressure generating elements arranged thereon.

Now, the present invention is explained in detail below by way of Examples and Comparative examples. All "%" and "part" used in Examples and Comparative Examples are by weight, unless otherwise specified.

EXAMPLE 1

(Synthesis of Resist Material)

A synthetic example of a polymer compound according to the present invention is shown below.

First, 3.5 kg (41.61 mol) of methyl isopropenyl ketone (MIPK), 875 g (6.15 mol) of n-butyl methacrylate (n-buMA) [the charge molar ratio: 6.77:1], and 42.4 g (0.258 mol) of azoisobutyronitrile were reacted for 9 hours under $N_2$ stream refluxing at 98° C. Subsequently, the reaction mixture was diluted with tetrahydrofuran. After cooled to room temperature, the mixture was reprecipitated with isopropyl alcohol. The precipitated solid matter was washed with isopropyl alcohol and dried. As a result, 2.1 kg of a polymer compound was obtained.

The number average molecular weight of the polymer compound was 12,000 and the weight average molecular weight was 39,000. The molar ratio of MIPK to n-buMA was 5.5:1 according to the amount of carbonyl groups determined by $C^{13}$ NMR. The polymer compound thus obtained was dissolved in cyclohexane at a concentration of 30% and then filtered to obtain a resist material solution.

The polymer compound contained in the resist material according to the present invention is represented by the general formula (I), where $R_1$ and $R_2$ are each independently a hydrogen atom, methyl group, ethyl group, a straight or branched propyl group, or the like. $R_3$ and $R_4$ are each independently an alkyl group such as methyl group, ethyl group or straight or branched alkyl group having about 3 to 6 carbon atoms. In particular, a polymer compound represented by the formula (1) where $R_1$, $R_2$, and $R_3$ are methyl and $R_4$ is an alkyl group having at least 2 carbon atoms, particularly n-butyl exhibits a remarkably improved sensitivity as a resist and therefore suitably used in the present invention. Furthermore, in the formula (1), the copolymerization ratio (molar ratio) m:n falling within the range of 10:1 to 4:1 is preferably used. By setting the copolymerization ratio within this range, the photosensitivity of the compound as a resist can be improved. Furthermore, by setting the copolymerization ratio within the range, it is possible to solve the handling problem of a resist material due to a too low softening point of the copolymer and the problem of film thinning during the development process. As a result, a resist material with good patterning properties can be obtained.

The polymer compound represented by the general formula (I) can be synthesized by copolymerization of monomers represented by general formulas (1)-i and (1)-ii shown below in accordance with a conventional method.

Furthermore, the preferable range of molecular weight of the polymer compound is: number average molecular weight of preferably 5,000 to 100,000, more preferably 10,000 to 50,000, and weight average molecular weight in the range of about 10,000 to 200,000, more preferably 20,000 to 100,000. If the molecular weight is within the aforementioned ranges, the contrast (the solubility difference to a developing solution) between the exposed portion and unexposed portion is improved in the developing process, and it is possible to control the viscosity of a coating solution prepared by dissolving the polymer compound in a solvent.

EXAMPLE 2

(Evaluation of Sensitivity of Resist Material)

A resist material according to the present invention prepared as mentioned above was applied by spin-coating to three identical Si wafers, but in different amounts. The resultant wafers were baked at 130° C. for 5 minutes to obtain three samples of (a), (b) and (c) having thicknesses shown in Table 1.

Subsequently, each of the three samples was exposed to light by using a mask aligner PLA (Canon Inc.) that uses a low-pressure mercury lamp as a light source to emit deep-UV by via a mask. Each of the samples was developed with a developing solution of methylisobutyl ketone and xylene in a volume ratio of 2:3 and washed with a rinse solution of xylene. The resist material used herein was a so-called positive resist material characterized in that the main chain of the polymer is cut by light irradiation to become soluble in the developing solution.

COMPARATIVE EXAMPLE 1

As a comparative example, three types of samples (d), (e) and (f) were prepared by using a monopolymer of MIPK named ODUR1010 (trade name, manufactured by Tokyo Ohka Kogyo Co., Ltd.) in the same manner as mentioned above. These samples were subjected to patterning in the same manner as mentioned above except that the samples were developed with a developing solution containing methylisobutyl ketone and xylene in a volume ratio of 2:1. This is because the ODUR1010 samples may not be sufficiently developed with the developing solution (containing methylisobutyl ketone and xylene in a volume ratio of 2:3) used in developing the resist material according to the present invention.

The results are shown in Table 1.

TABLE 1

| | Sample | Evaluation result | |
| --- | --- | --- | --- |
| | | Film thickness ($\mu$m) | Minimum exposure count |
| Example 1 | (a) | 10.5 | 5 |
| | (b) | 15.2 | 7 |
| | (c) | 19.8 | 8 |
| Comparative | (d) | 10.3 | 20 |
| Example 1 | (e) | 14.9 | 28 |
| | (f) | 20.1 | 41 |

The term "minimum exposure count" used herein refers to the lowest exposure that can resolve 5 to 10 $\mu$m line-and-space pattern on a mask. As is apparent from Table 1, the sensitivity of the resist material of the present invention is about four times as high as that of ODUR1010. In particular, this tendency becomes more apparent as the film thickness increases.

EXAMPLE 3

(Example of Manufacturing Inkjet Recording Head)

FIGS. 1 to 11 schematically illustrate a basic embodiment of a method of manufacturing an inkjet-recording head according to the present invention. FIG. 1 shows that plurality of electro-thermal converting elements 2 are arranged on a silicon substrate 1 as ink ejection pressure-generating elements. To the electro-thermal converting element 2, an electrode (not shown) and an IC circuit (not shown) are connected to operate the elements.

Figure 2:
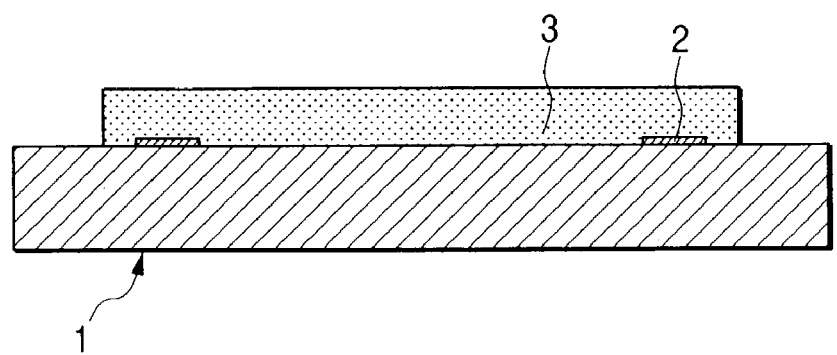
FIG. 2 is a schematic sectional view of a substrate having an ink flow-path pattern 3 formed thereon.
Figure 3:
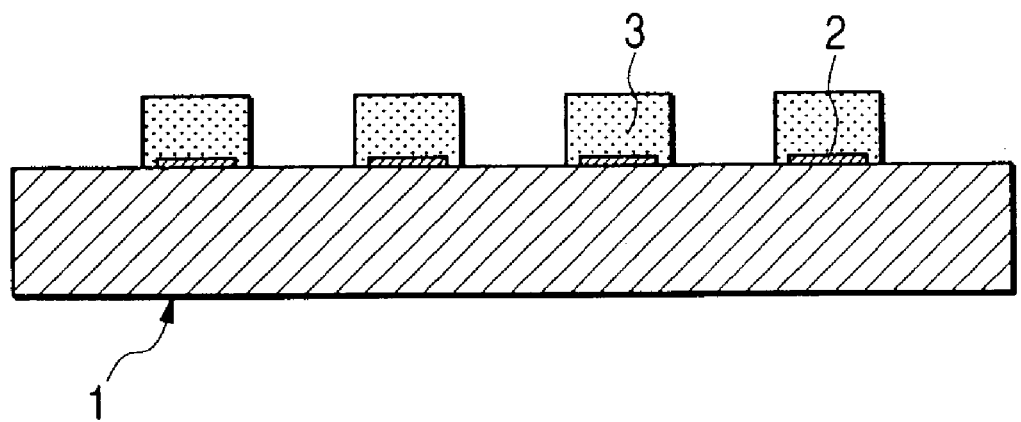
FIG. 3 is a schematic sectional view of a substrate having an ink flow path pattern 3 formed thereon.

Next, as shown in FIG. 2 (a sectional view taken along the line A–A' of FIG. 1) and FIG. 3 (a sectional view taken along the line B–B' of FIG. 1), an ink flow-path pattern 3 is formed with the resist material of the present invention on the silicon substrate 1. A preferable method for forming the ink flow-path pattern 3 is more specifically described in Example 4.

Figure 4:
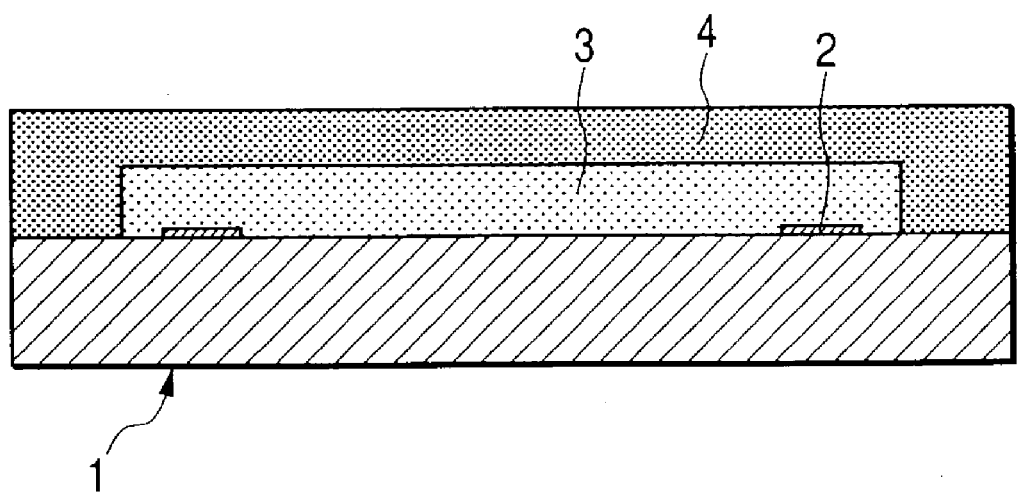
FIG. 4 is a schematic sectional view of a substrate further having a coating resin layer 4 formed thereon.
Figure 5:
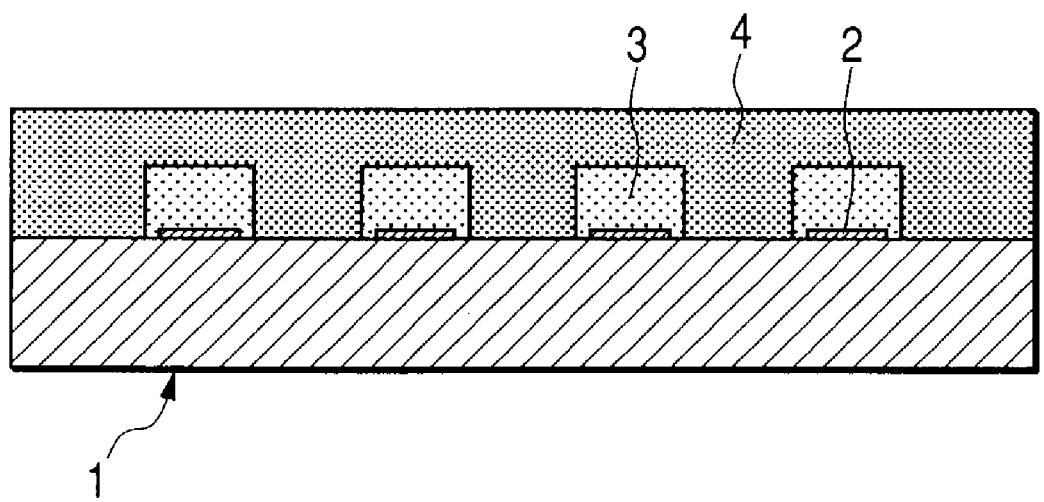
FIG. 5 is a schematic sectional view of a substrate further having a coating resin layer 4 formed thereon.

Subsequently, an epoxy resin-containing coating resin dissolved in a solvent is applied onto the flow path pattern 3 by a solvent coat method such as spin-coating to form a coating resin layer 4 to be walls of ink flow-path, as is shown in FIGS. 4 and 5.

Figure 6:
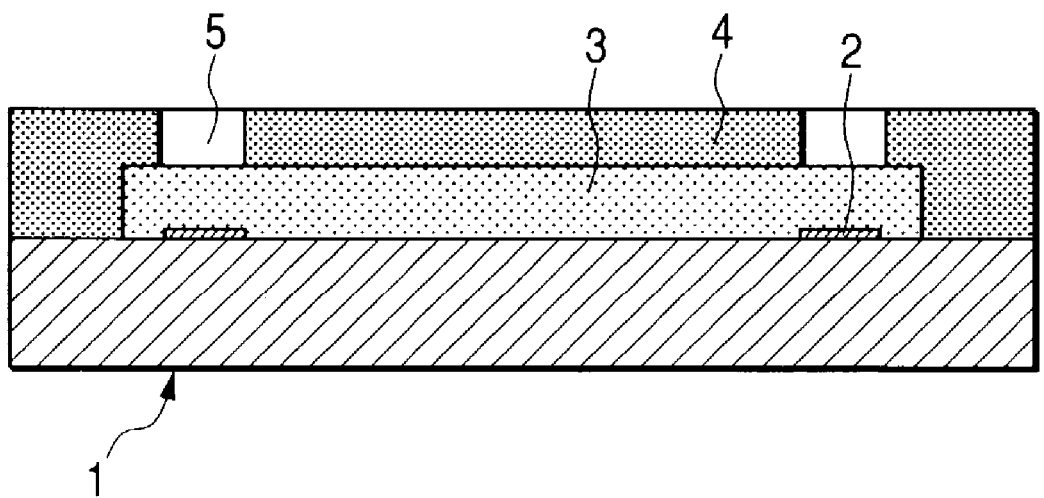
FIG. 6 is a schematic sectional view of a substrate having an ink ejection opening 5 formed therein.
Figure 7:
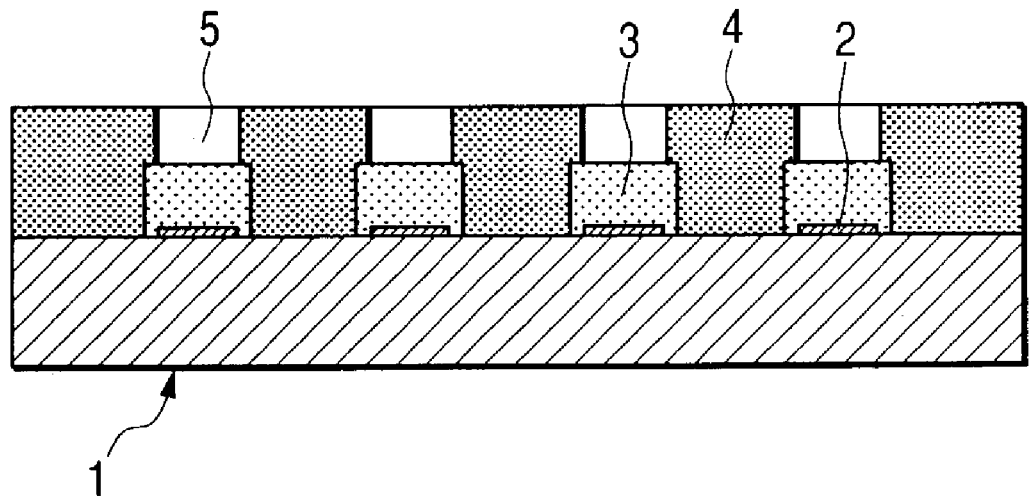
FIG. 7 is a schematic sectional view of a substrate having an ink ejection opening 5 formed therein.

To form an inkjet recording head, an ejection opening 5 is formed through the coating resin layer 4 as shown in FIGS. 6 and 7. The ejection opening 5 can be formed by exposing (light curing) and developing the photosensitive coating resin layer 4 by a conventional photolithography technique.

Figure 8:
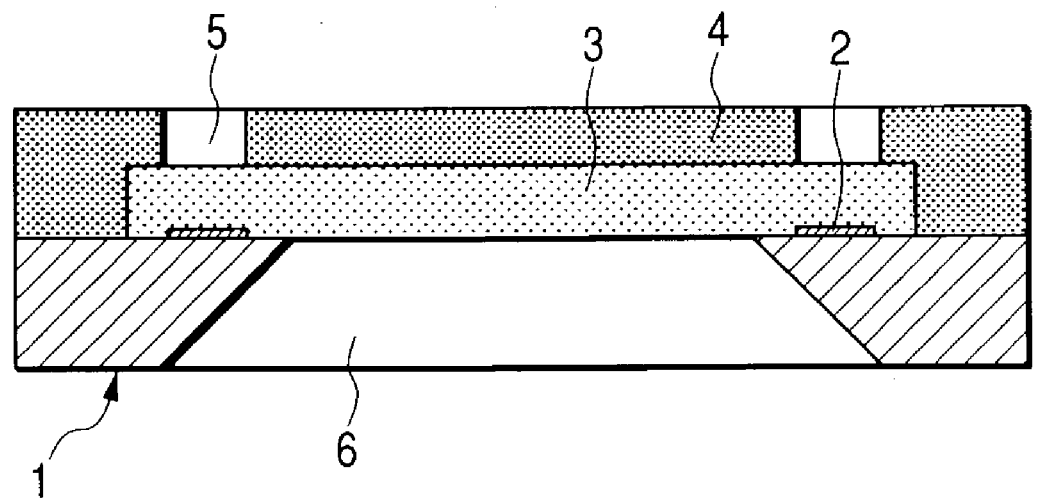
FIG. 8 is a schematic sectional view of a substrate having an ink supply port 6 formed therein.
Figure 9:
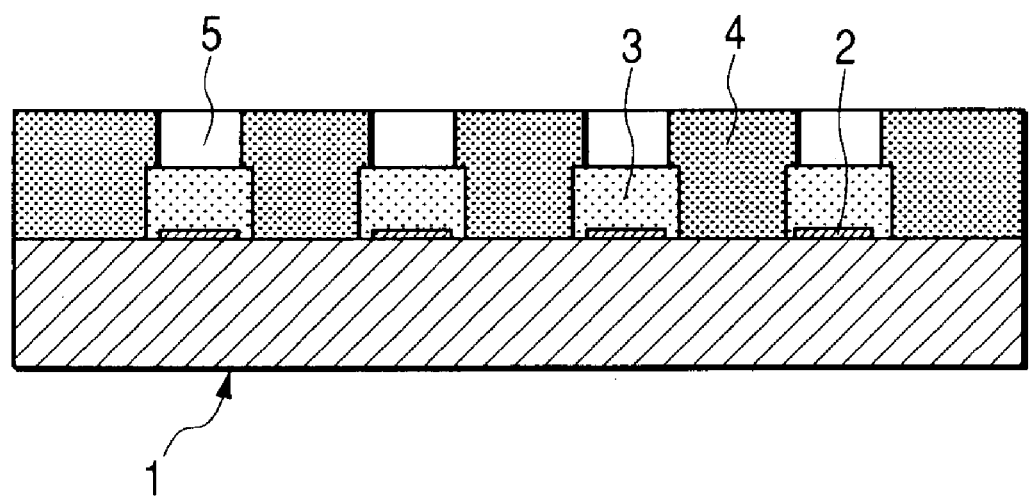
FIG. 9 is a schematic sectional view of a substrate having an ink supply port 6 formed therein.

Subsequently, as shown in FIGS. 8 and 9, anisotropic etching is performed from the rear surface of the silicon substrate 1 to make an ink supply port 6. To form the ink supply port 6, it is also possible to use a substrate in which an ink supply port has been mechanically formed in advance.

Figure 10:
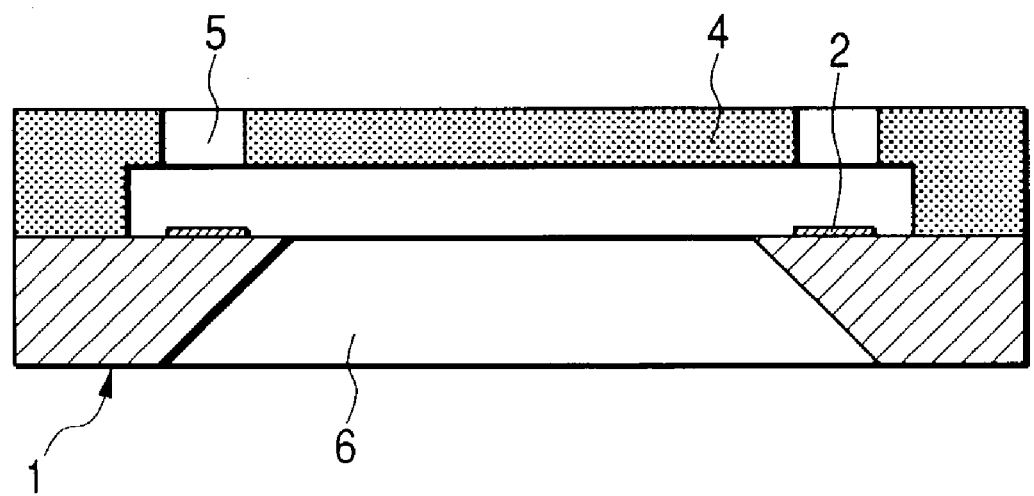
FIG. 10 is a schematic sectional view of a substrate after a flow-path pattern 3 was dissolved out.
Figure 11:
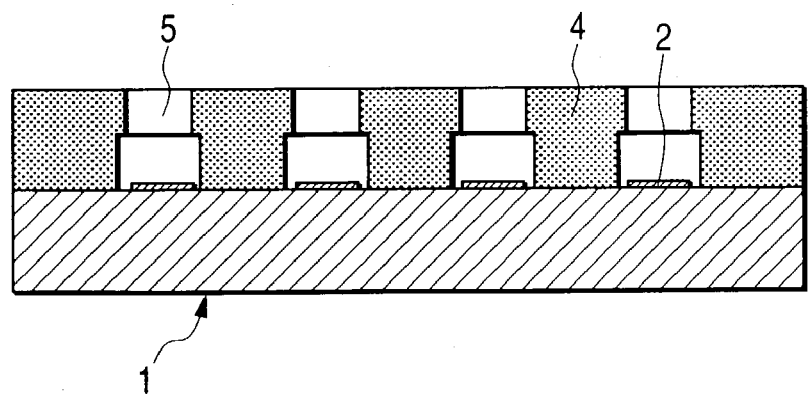
FIG. 11 is a schematic sectional view of a substrate after a flow-path pattern 3 was dissolved out.

Finally, as shown in FIGS. 10 and 11, the ink flow-path pattern 3 is dissolved away to form nozzle portion. Then, electrical connection and attachment of an ink supply member (not shown) are done to accomplish the formation of the inkjet-recording head.

EXAMPLE 4

(Example of Manufacturing Inkjet Recording-head)

In this example, an inkjet-recording head was manufactured in accordance with the procedure shown in FIGS. 1 to 11. First, on the silicon substrate 1, electrothermal conversion elements 2 (tantalum nitride, TaN) of 25 $\mu$m-square were arranged in two lines per single chip as shown in FIG. 1. In total 256 electro-thermal converting elements were arranged at a pitch of 600 DPI (1200 DPI per head) to be in a zigzag fashion between two lines and thereby 256 nozzles were arranged. Note that 200 chips having an identical structure were arranged on one silicon substrate.

To form the ink flow-path pattern 3, the resist material of the present invention used in Example 1 was applied by spin coating and dried to form a film. Subsequently, pattern-exposure was performed via a mask by mask aligner PLA (deep-UV applicable) manufactured by Cannon Kabushiki Kaisha (exposure: 8 count), and then, development was performed with a developing solution containing methyl-isobutyl ketone and xylene in a volume ratio of 2:3 and a rinse solution consisting of xylene to form the ink flow-path pattern 3. The film thickness of the flow path pattern 3 was adjusted to 14 $\mu$m.

Next, coating resin components shown in the following Table 2 were dissolved in 2-ethoxyethanol at a concentration of 55%. The resultant solution was applied onto the flow-path pattern 3 by spin coating controlling spin rotation speed so as to obtain a film thickness of 12 $\mu$m, and then the substrate was baked at 90° C. for 3 minutes for drying. In this manner, the coating resin layer 4 was formed. Note that EHPE3150 shown in Table 2 is an epoxy resin having an oxycyclohexane skeleton. A cured product of the epoxy resin is excellent in ink resistance and adhesiveness to the substrate and therefore is the most suitable material for inkjet nozzles.

TABLE 2

| Coating resin composition | | |
| --- | --- | --- |
| Epoxy resin | EHPE3150 (Daicel Chemical Industries, Ltd.) | 100 parts |
| Photo cationic polymerization initiation agent | SP170 (Asahi Denka Co., Ltd.) | 2 parts |
| Fluorine-base additive | 1.4-HFAB (Central Glass Co., Ltd.) | 20 parts |
| Silane coupling agent | A-187 (Nippon Unicar Co., Ltd.) | 5 parts |

Since the coating resin layer 4 contained a photo cationic polymerization initiation agent and was imparted with negative-type sensitivity, an ejection opening 5 can be formed through the coating resin layer 4 by photolithography. More specifically, the ejection opening 5 was formed by pattern-exposure via a mask by using a mask aligner MPA 600 manufactured by Canon Kabushiki Kaisha, followed by heating at 90° C. for 30 minutes, and a developing process. The ejection opening 5 was formed in the shape of a star as shown in FIG. 12.

The reason why the ejection opening 5 is formed in a star shape is that the peripheral length of the ejection opening 5 is increased, the meniscus is stabilized, which improves shooting accuracy of ink droplets ejected onto a recording medium, so that a high quality image is provided.

Figure 12:
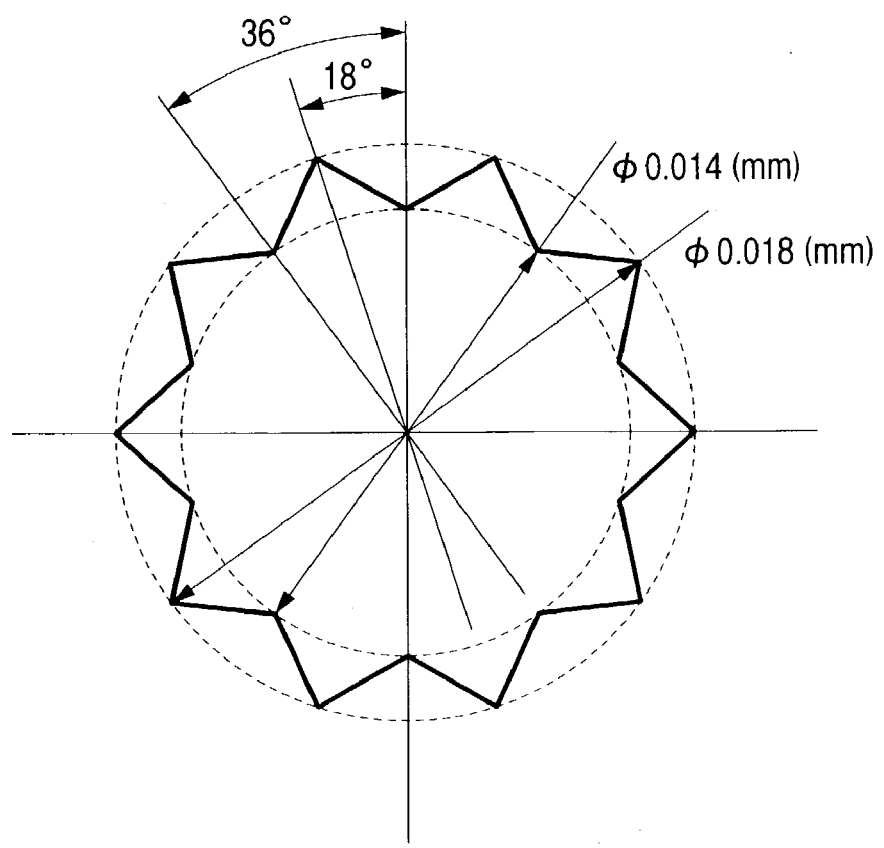
FIG. 12 is an illustration of star-shape ejection opening 5.

The inventors of the present invention have found that, when the ejection opening has a complicated shape as shown in FIG. 12, unless the difference in refractive index of the pattern 3 and the coating layer 4 is 0.03 or less, the star pattern cannot be completely resolved at the interface of the layer 4 and the pattern 3 due to the reflection taking place between them and a minute eaves-like projection 7 (see FIG. 13) is formed at the interface, although the surface of the coating resin layer 4 can be formed in accordance with the mask pattern. Furthermore, it was confirmed that the formation of such a minute projection increases as the thickness of the coating resin layer 4 increases.

The refractive indexes of the flow-path pattern 3 and the coating resin layer 4 used in this example were 1.47 and 1.45, respectively. Thus, the difference in refractive index between them was 0.02.

Subsequently, the rear surface of the silicon substrate 1 was anisotropically etched via a mask to form an ink supply port 6 shown in FIGS. 8 and 9. Thereafter, the ink flow-path pattern 3 remaining up to this step was decomposed by applying light over the entire surface and removed with methyl lactate. Finally, to cure the coating resin layer 4 completely, heating was performed at 200° C. for one hour. After the nozzle structure was constructed in this way, chips were cut out of the Si wafer, electric contact was made, and an ink supply member was arranged to obtain an inkjet-recording head.

COMPARATIVE EXAMPLE 2

For comparison, an ink jet recording head was prepared in the same manner as in Example 4 except that the material for forming the flow-path pattern 3 of was replaced with ODUR1010 (PMIPK manufactured by Tokyo Ohka Kogyo Co., Ltd) of which refractive index was 1.49, a light exposure amount was 30 counts, and a solution consisting of methylisobutyl ketone and xylene in a volume ratio of 2:1 was used as the developing solution.

Print test was performed by using inkjet-recording heads obtained in Example 4 and Comparative Example 2. Deviation of the landing point of ejected droplets (ejection volume: 4.5 pl) from the ideal point was measured. As a result, deviation (σ) was 3.5 μm in the inkjet-recording head of Example 4, whereas 6.1 μm in that of Comparative Example 4.

Cross-section observation was made for the chips obtained in Example 4 and Comparative Example 2. In the head of Example 4, a star-shaped ejection opening was formed precisely even at the interface between the flow-path patter 3 and the coating resin layer 4 and no eaves-like projection 7 was observed. On the other hand, in the head of Comparative Example 2, the star-shaped ejection opening was not sufficiently resolved at the interface between the pattern 3 and the resin layer 4 and minute eaves-like projection 7 was observed. These projection 7 is considered to be formed by reflection taking place at the interface between the flow-path pattern 3 and the coating resin layer 4 in the light exposure step to form the ejection openings. This suggests that the formation of projection can be prevented or suppressed by reducing the difference in refractive index between the pattern and the layer. It is thus preferable that the difference in refractive index between the flow path pattern 3 and the coating resin layer 4 be set at 0.03 or less. Since the shape of nozzles of these heads were identical except for the interface region, it is considered that the minute difference at the interface region may be the cause of different landing accuracy.

As is apparent from Example 4 and Comparative Example 2, it is demonstrated that by employing the resist material of the present invention, light exposure time can be reduced to increase the productivity. Furthermore, the shooting accuracy of the ink droplets can be improved to obtain higher quality images.

EXAMPLE 5

(Example of Manufacturing Inkjet Recording Head)

In this example, an inkjet-recording head was manufactured in accordance with the procedure shown in FIGS. 1 to 11. In this example, a head capable of ejecting about 30 pl of ink droplets was manufactured by increasing the thickness of the coating resin layer 4. The head can be suitably used for recording letter images and the like at a high speed.

Figure 14:
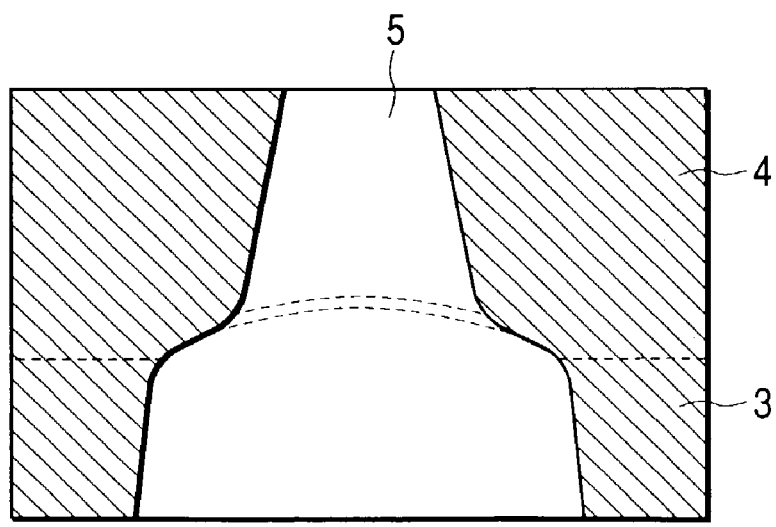
FIG. 14 is a schematic sectional view of a nozzle formed by using a flow path pattern 3 made of a resist material of the present invention.

The flow path pattern 3 was formed with the resist material according to the present invention prepared in Example 1, with a film thickness of 25 μm. The coating resin layer 4 of 50 μm thickness was formed on the flow-path pattern 3 by multiple coating. FIG. 14 shows a schematic illustration of a sectional photograph of a nozzle structure formed in the same manner as in Example 4 except for the aforementioned conditions.

COMPARATIVE EXAMPLE 3

Figure 13:
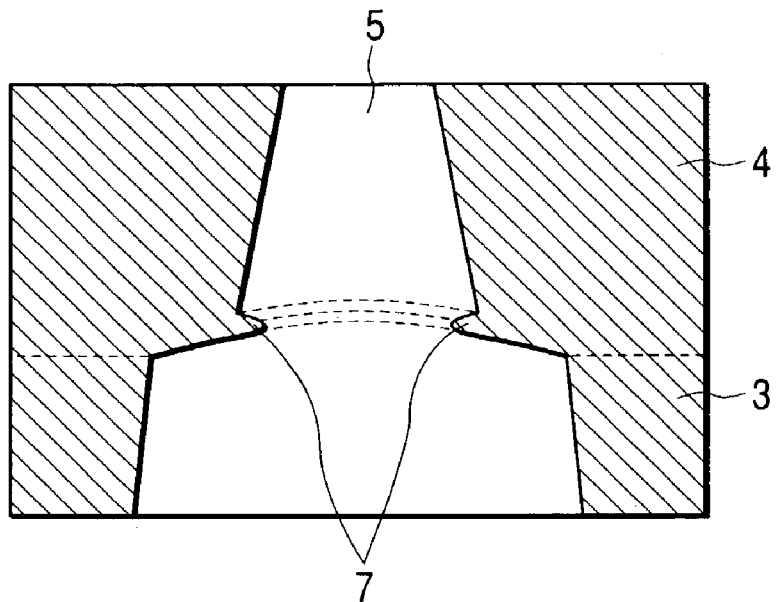
FIG. 13 is a schematic sectional view of a nozzle formed by using a flow-path pattern 3 made of a resist material ODUR1010.

As a comparative example, a nozzle was manufactured in the same manner as in Example 5 except that the flow-path pattern 3 was formed with a resist material, ODUR 1010 (trade name of PMIPK manufactured by Tokyo Ohka Kogyo Co., Ltd). FIG. 13 shows a schematic illustration of a sectional photograph of a nozzle structure thus obtained. From both figures, it is suggested that formation of minute eaves-like projection 7 at the interface region can be prevented by reducing the difference in refractive index between the flow path pattern 3 and the coating resin layer 4.

As is explained in the foregoing, the present invention provides a highly sensitive resist material, use of such a resin in manufacturing an inkjet-recording head to improve the productivity, and an inkjet-recording head excellent in ink shooting accuracy.

What is claimed is:

1. A method of manufacturing an inkjet recording head comprising the steps of:
   (i) forming a layer comprising a resist material on a substrate on which an ink ejection pressure generating element has been provided, and patterning the layer to form an ink flow-path pattern, the resist material comprising a polymer compound represent by a general formula (1) below;

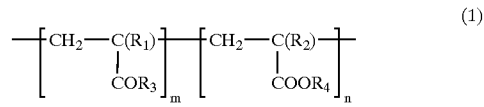

where $R_1$ and $R_2$ are each independently a hydrogen atom or an alkyl group: $R_3$ and $R_4$ are each independently an alkyl group; and m and n are positive integers;

(ii) applying a liquid containing an epoxy resin that is solid at normal temperature onto the ink flow-path pattern to form a coating resin layer to be an ink flow-path wall;
   (iii) removing a portion of the coating resin layer disposed above the ink ejection pressure generating element to form an ink ejection opening; and (iv) removing the ink flow-path pattern,
wherein, in the step (ii), the difference in refractive index between the coating resin layer formed on the ink flow-path pattern and the ink flow-path pattern is 0.03 or less.

2. The method of manufacturing an inkjet recording head according to claim 1, wherein the coating resin layer contains an epoxy resin having an oxycyclohexane skeleton.

3. The method of manufacturing an inkjet recording head according to claim 1, wherein $R_1$, $R_2$ and $R_3$ are each independently a methyl group, and $R_4$ is an alkyl group having at least two carbon atoms.

4. The method of manufacturing an inkjet recording head according to claim 3, wherein $R_4$ is an n-butyl group.

5. The method of manufacturing an inkjet recording head according to claim 1, wherein m:n falls within the range of 10:1 to 4:1.

6. The method of manufacturing an inkjet recording head according to claim 1, wherein a number average molecular weight of the polymer compound represented by the general formula (1) falls within the range of 5,000 to 100,000, and a weight average molecular weight of the polymer compound represented by the general formula (1) falls within the range of 10,000 to 200,000.

* * * * *